(12) United States Patent
Kim

(10) Patent No.: US 7,408,983 B2
(45) Date of Patent: Aug. 5, 2008

(54) DIGITAL FILTER

(75) Inventor: Woo Chan Kim, Gyeonggi-do (KR)

(73) Assignee: LG Electronics, Inc., Seoul (KR)

( * ) Notice: Subject to any disclaimer, the term of this patent is extended or adjusted under 35 U.S.C. 154(b) by 633 days.

(21) Appl. No.: 11/029,508

(22) Filed: Jan. 6, 2005

(65) Prior Publication Data
US 2005/0152444 A1    Jul. 14, 2005

(30) Foreign Application Priority Data
Jan. 9, 2004    (KR) .................. 10-2004-0001682

(51) Int. Cl.
*H03K 5/159*    (2006.01)
(52) U.S. Cl. ...................... 375/232; 375/229
(58) Field of Classification Search ............ 375/229–34
See application file for complete search history.

(56) References Cited

U.S. PATENT DOCUMENTS

| | | | |
|---|---|---|---|
| 5,642,382 A * | 6/1997 | Juan .......................... | 375/232 |
| 5,799,037 A * | 8/1998 | Strolle et al. ................ | 375/233 |
| 5,912,828 A * | 6/1999 | Mondal et al. .............. | 708/323 |
| 5,999,223 A * | 12/1999 | Patel et al. ................. | 348/555 |
| 6,396,548 B1 * | 5/2002 | Gornstein et al. ........... | 348/725 |
| 6,434,193 B1 * | 8/2002 | Fukuoka ..................... | 375/235 |
| 6,680,971 B1 * | 1/2004 | Tazebay et al. ............. | 375/235 |
| 6,870,880 B2 * | 3/2005 | Tokunaga et al. ........... | 375/229 |
| 2002/0118741 A1 * | 8/2002 | Tokunaga et al. ........... | 375/229 |

FOREIGN PATENT DOCUMENTS

| | | |
|---|---|---|
| KR | 10-2003-0000307 | 10/2003 |
| KR | 10-2003-0000317 | 10/2003 |

\* cited by examiner

*Primary Examiner*—David C. Payne
*Assistant Examiner*—Leon Flores
(74) *Attorney, Agent, or Firm*—Birch, Stewart, Kolasch & Birch, LLP

(57) ABSTRACT

Disclosed is a digital filter with a combined architecture of a 4-tap real valued filter and a-tap complex valued filter, whereby the filter size is reduced and no output delay is occurred due to the filter operations. According to the present invention, the digital filter is operated either in real valued filter mode or complex valued filter mode according to a mode selection signal, a filter output is obtained within one clock according to an operation selection signal, and an operator performs operations twice within one symbol clock (i.e., a time period) unlike a related art filter in which an operator performs the operation only once for each symbol clock. Therefore, the present invention filter is capable of resolving the filter size problem by substantially reducing the number of multipliers and adders.

24 Claims, 9 Drawing Sheets ei = erri
eq = errq

DIGITAL FILTER

This application claims the benefit of the Korean Patent Application No. 10-2004-0001682, filed on Jan. 9, 2004, which is hereby incorporated by reference as if fully set forth herein.

BACKGROUND OF THE INVENTION

1. Field of the Invention

The present invention relates to a digital filter with a combined architecture of a 4-tap real valued filter and a-tap complex valued filter, whereby the filter size is reduced and no output delay is occurred due to the filter operations.

2. Background of the Related Art

A digital filter based on the LMS (Least Mean Square) adaptive algorithm is a filter capable of upgrading or adapting coefficients on an ongoing basis. The LMS adaptive digital filter is usually used for an equalizer or a noise eliminator housed in a digital broadcasting receiver, in order to compensate the distortions generated by a channel or a system itself.

Adaptive filters are largely categorized into two groups: one with real valued signals and real coefficients, and the other with complex valued input signal and complex valued coefficients. Filters with real coefficients and real valued inputs are useful for VSB ground wave digital broadcasts composed of real valued data only. Meanwhile, filters with complex valued input signals and complex valued coefficients are useful for a QAM-based system such as a digital cable broadcasting composed of both real valued and imaginary valued data. To combine the above two systems into one chip, two kinds of filters should be used.

However, when two systems combined in one chip are selectively operated, only one of the filters is used and the other filter does nothing being useless. In the case of a multi-tap filter the filter is usually built in a dual structure, which resultantly enlarges the size of the entire filter, making it more difficult to implement, and system resources are wasted. A filter architecture based on the system computing one tap per symbol clock cannot be also realized if the filter size is large.

Therefore, it will be advantageous to develop a dual system filter combined in one chip where two filters are not operated simultaneously but selectively according to a user's choice, for example, depending on the nature of a system the filter is applied to, the filter functions as a real valued filter with real coefficients or a complex valued filter with complex valued coefficients. Moreover, the entire filter size can be reduced by designing the filter in such a manner that an operator thereof performs computations twice, instead of once as in the related art, per symbol clock.

SUMMARY OF THE INVENTION

Accordingly, the present invention is directed to a digital filter that substantially obviates one or more problems due to limitations and disadvantages of the related art.

An object of the present invention is to provide a digital filter having a combined architecture of a 4-tap real valued filter and a 1-tap complex valued filter, in which a filter output is obtained for a symbol clock and one operator performs computations twice for each symbol clock, whereby no output delay is caused by filter operations and complexity of the filter is much reduced.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital filter includes: a control unit for generating and outputting a mode selection signal through which the operations of a real valued filter and a complex valued filter are determined, and an operation selection signal for controlling corresponding operators perform the operations twice for a clock (clk); a data input unit for selecting an input real valued data and an input imaginary valued data according to the mode selection signal, delaying the data, respectively, selecting the input data and delayed data again according to the mode selection signal and the operation selection signal, and outputting the selected data for coefficient update and filter output; a first coefficient update unit for multiplying the selected output data from the data input unit by an error value that is selected according to the mode selection signal and the operation selection signal; adding the multiplication result to an old coefficient that is selected according to the mode selection signal and the operation selection signal and thereby, updating two coefficients of the real valued filter and a real coefficient of the complex valued filter within one clock; a second coefficient update unit for multiplying the selected output data from the data input unit by an error value that is selected according to the mode selection signal and the operation selection signal, adding the multiplication result to an old coefficient that is selected according to the mode selection signal and the operation selection signal and thereby, updating two coefficients of the real valued filter and a real coefficient of the complex valued filter within one clock; a first filter output unit for multiplying two data selectively outputted from the data input unit for a clock by the two coefficients of the real valued filter or the real coefficient of the complex valued filter provided from the first coefficient update unit and thereby, generating two tap outputs of the real valued filter or two outputs of the complex valued filter; and a second filter output unit for multiplying two data selectively outputted from the data input unit for a clock by the two coefficients of the real valued filter or the real coefficient of the complex valued filter provided from the second coefficient update unit and thereby, generating two tap outputs of the real valued filter or two outputs of the complex valued filter.

In the exemplary embodiment of the present invention, the data input unit includes: a first data selection part for selecting within a clock a delayed real valued data and a delayed imaginary valued data, each being delayed by a predetermined period, according to the mode selection signal, and outputting the selected two data to the first coefficient update unit; a second data selection part for delaying a delayless input real valued data and a delayless input imaginary valued data, respectively, selecting two data among the input data and the delayed data within a clock according to the mode selection signal and the operation selection signal, and outputting the selected two data to the first filter output unit; a third data selection part for selecting within a clock a delayed real valued data and a delayed imaginary valued data, each being delayed by a predetermined period, according to the mode selection signal, and outputting the selected two data to the second coefficient update unit; and a fourth data selection part for delaying a delayless input real valued data, a delayless input imaginary valued data, and input data from the second data selection part, respectively, selecting two data among the input data and the delayed data within a clock according to the mode selection signal and the operation selection signal, and outputting the selected two data to the second filter output unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

The present invention digital filter is characterized of a combined architecture of a 4-tap real valued filter and a 1-tap complex valued filter, through which a filter output is obtained for a symbol clock and one operator performs computations twice for each symbol clock, whereby no output delay caused by filter operations is made and complexity of the filter is much reduced.

Figure 1A:
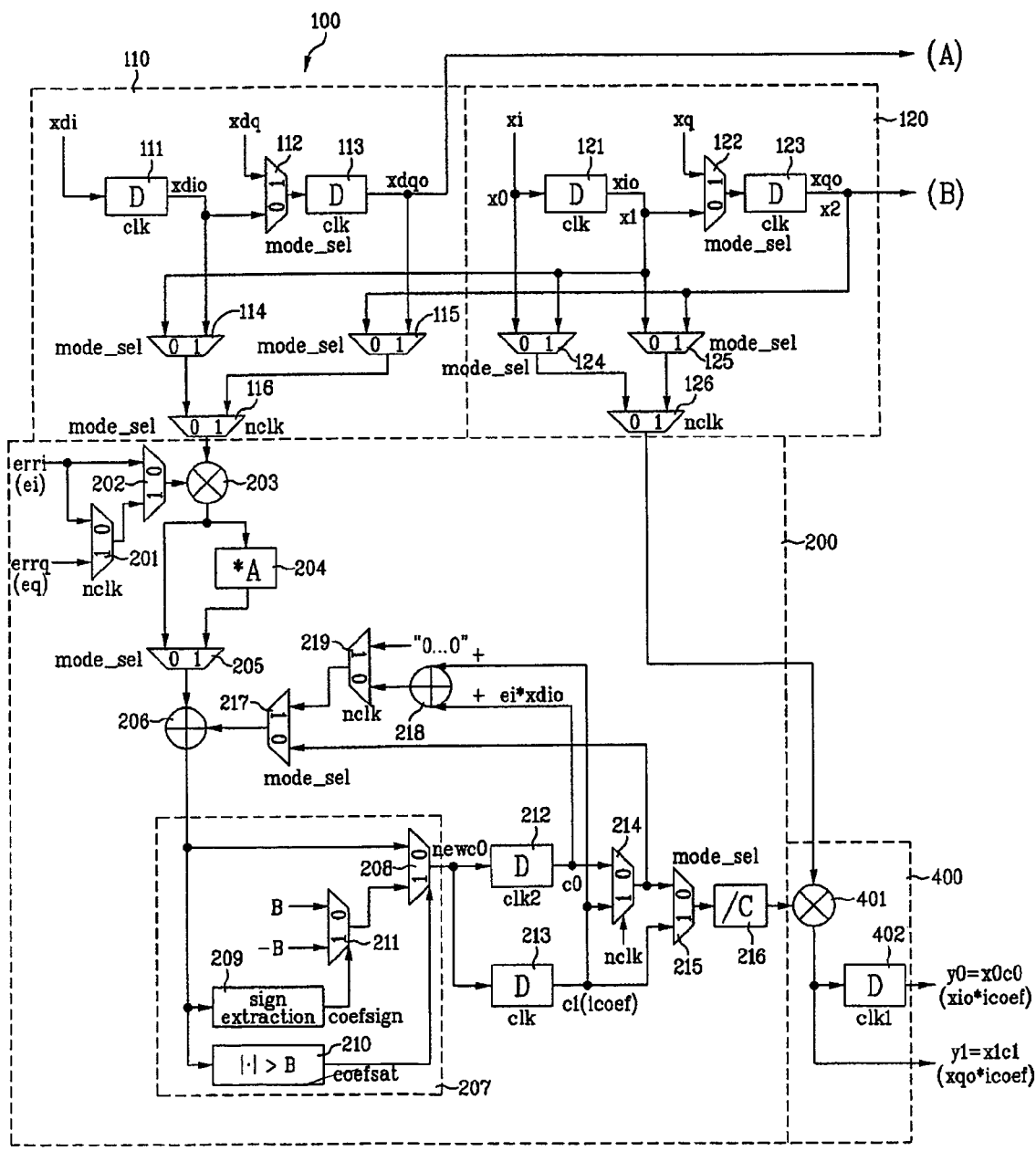
FIG. 1A and FIG. 1B are schematic block diagrams illustrating a digital filter according to the present invention.
Figure 1B:
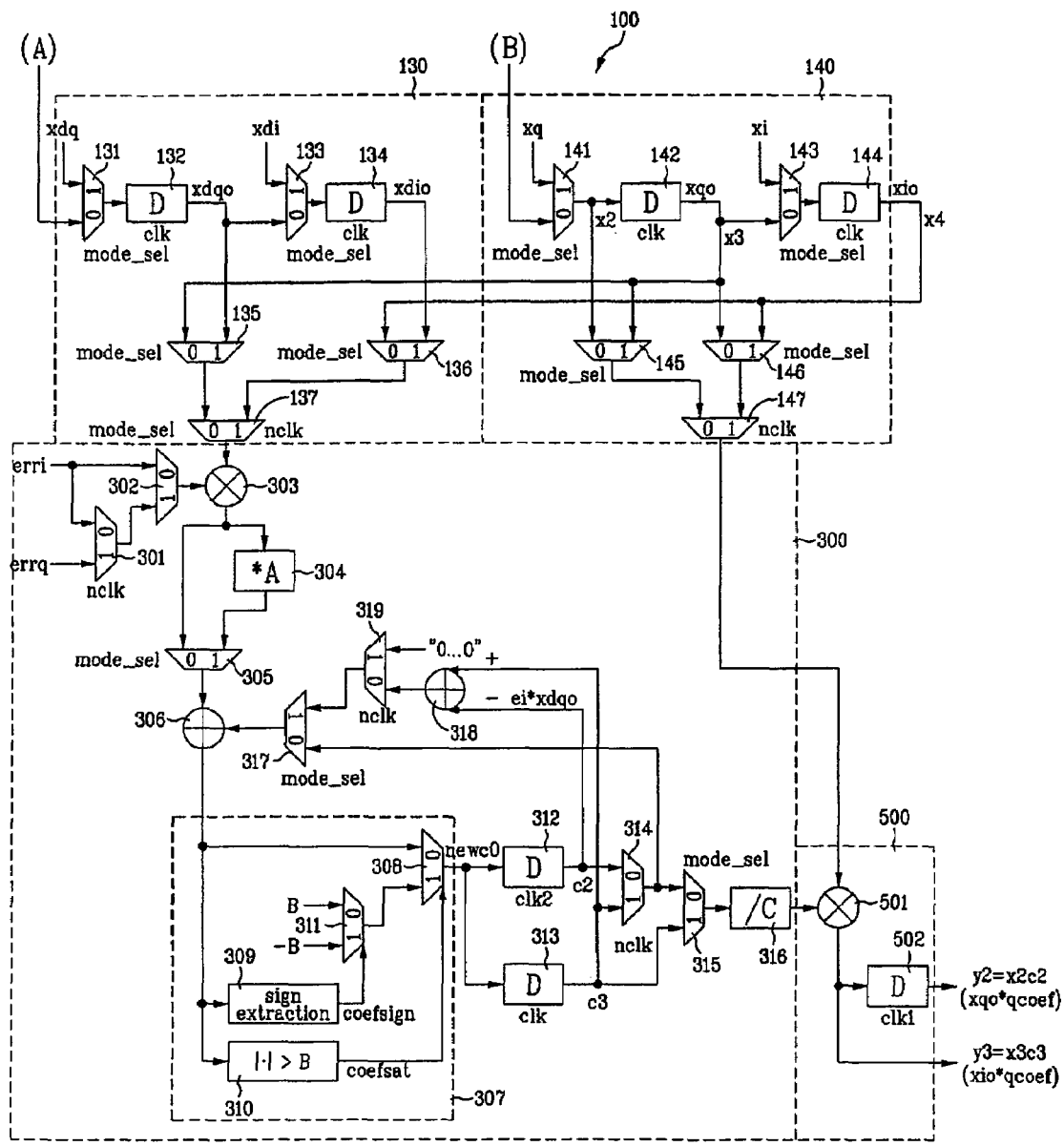

FIG. 1A and FIG. 1B are schematic block diagrams illustrating a digital filter according to the present invention. As shown in the drawing, the digital filter of the present invention includes a data input unit 100, a first and a second coefficient update units 200, 300, and a first and a second filter output unit 400, 500.

The data input unit 100 receives a real valued data, an imaginary valued data, a delayed real valued data that is obtained by delaying the real valued data, and a delayed imaginary valued data that is obtained by delaying the imaginary valued data; selects data according to a mode selection signal mode_sel and delays the selected data; selects the input data and delayed data again according to the mode selection signal mode_sel and an operation selection signal nclk; and outputs the selected data to the first and second coefficient update units 200, 300 and the first and second filter output units 400, 500.

The data input unit 100 includes first to fourth data selection parts 110~140.

The first data selection part 110 selects delayed real valued data and delayed imaginary valued data according to the mode selection signal mode_sel, and delays the data again. Later the first data selection part 110 selects the delayed signal or an output signal from the second data selection part 120 according to the selection signal mode_sel and the operation selection signal nclk, and outputs the selected signal to the first coefficient update unit 200.

More specifically, the first data selection part 110 includes a plurality of delays 111, 113, and four selectors 112, 114~116. The delay 111 delays a delayed real valued data xdi for a clock signal clk and outputs the delayed data to the selectors 112, 114. If the mode selection signal is 0 (i.e., mode_sel=0), the selector 112 selects xdio outputted from the delay 111, and if the mode_sel=1 it selects imaginary data xdq, and outputs the selected data to the delay 113. The delay 113 delays the output from the delay 112 for a clock signal clk and outputs the delayed data to the selector 115 and the third data selection part 130. If the mode_sel=0 the selector 114 selects the output from the second data selection part 120, and if the mode_sel=1 it selects the output from the delay 111, and outputs the selected data to the selector 116. If the mode_sel=0 the selector 115 selects the output from the second data selection part 120, and if the mode_sel=1 it selects the output from the delay 113, and outputs the selected data to the selector 116. The selector 116 selects, according to the operation selection signal nclk, the output from the selector 114 or the output from the selector 115, and outputs it to the first coefficient update 200.

The second data selection part 120 selects input real valued data and input imaginary valued data according to the mode selection signal mode_sel, delays the selected data, and outputs the delayed data to the first data selection part 110. At the same time, the second data selection part 120 selects the input signal or the delayed signal again according to the mode selection signal mode_sel and the operation selection signal nclk, and outputs the selected signal to the first filter output unit 400.

The second data selection part 120 includes a plurality of delays 121, 123, and four selectors 122, 124~126. Input real valued data xi is provided to the delay 121 and the selector 124. The delay 121 delays the input real valued data xi for a clock signal clk, and outputs the delayed data to the selector 114 of the first data selection part 110 and the selectors 122, 124, 125 of the second data selection part 120. The selector 122 selects an output xio from the delay 111 and input imaginary valued data xq according to the mode selection signal mode_sel, and outputs the selected data to the delay 123. The delay 123 delays the output from the selector 122 for a clock signal clk and outputs the delayed data to the selector 115 of the first data selection part 110, the selector 125 of the second data selection part 120, and the fourth data selection part 140, respectively. If the mode_sel=0 the selector 125 selects the output from the delay 121, and if the mode_sel=1 it selects the output from the delay 123, and outputs the selected data to the selector 126. The selector 126 selects, according to the operation selection signal nclk, the output from the selector 124 or the output from the selector 125, and outputs the selected data to the first filter output unit 400.

The third data selection part 130 selects delayed real valued data and delayed imaginary valued data according to the mode selection signal mode_sel, and delays the data again. Later the third data selection part 130 selects the delayed signal or an output signal from the fourth data selection part 140 according to the selection signal mode_sel and the operation selection signal nclk, and outputs the selected signal to the second coefficient update unit 300.

The third data selection part 130 includes a plurality of delays 132, 134, and five selectors 131, 133, 135~137. The delayed imaginary valued data xdq is outputted to the selector 131. If the mode_sel=0 the selector 131 selects the output (A) from the first data selection part 110, and if the mode_sel=1 it selects the delayed imaginary data xdq, and outputs the selected data to the delay 132. The delay 132 delays the output from the selector 131 for a clock signal clk and outputs the delayed data to the selectors 133, 135. If the mode_sel=0 the selector 133 selects the output from the delay 132, and if the mode_sel=1 it selects delayed real valued data xdi, and outputs the selected data to the delay 134. The delay 134 delays the output from the selector 133 for a clock signal clk and outputs the delayed data to the selectors 136. If the mode_sel=0 the selector 135 selects the output from the fourth data selection part 140, and if the mode_sel=1 it selects the output from the delay 132, and outputs the selected data to the selector 137. If the mode_sel=0 the selector 136 selects the output from the fourth data selection part 140, and if the mode_sel=1 it selects the output from the delay 134, and outputs the selected data to the selector 137. The selector 137 selects, according to the operation selection signal nclk, the output from the selector 135 or the output from the selector 136, and outputs it to the second coefficient update unit 300.

The fourth data selection part 140 selects input real valued data and input imaginary valued data according to the mode selection signal mode_sel, delays the selected data, and outputs the delayed data to the third data selection part 130. At the same time, the fourth data selection part 140 selects the input signal or the delayed signal again according to the mode selection signal mode_sel and the operation selection signal nclk, and outputs the selected signal to the second filter output unit 500.

The fourth data selection part 140 includes a plurality of delays 142, 144, and five selectors 141, 143, 145~147. Input imaginary valued data xq is outputted to the selector 141. If the mode_sel=0 the selector 141 selects the output (B) from the second data selection part 120, and if the mode_sel=1 it selects the imaginary data xq, and outputs the selected data to the delay 142. The delay 142 delays the output from the selector 141 for a clock signal clk and outputs the delayed data to the selector 135 of the third data selection part 130 and the selectors 143, 145, 146 of the fourth data selection part 140. If the mode_sel=0 the selector 143 selects the output from the delay 142, and if the mode_sel=1 it selects real valued data xi, and outputs the selected data to the delay 144. The delay 144 delays the output from the selector 143 for a clock signal clk and outputs the delayed data to the selectors 136 of the third data selection part 130 and the selector 146 of the fourth data selection part 140. If the mode_sel=0 the selector 145 selects the output from the selector 141, and if the mode_sel=1 it selects the output from the delay 142, and outputs the selected data to the selector 147. If the mode_sel=0 the selector 146 selects the output from the delay 142, and if the mode_sel=1 it selects the output from the delay 144, and outputs the selected data to the selector 147. The selector 147 selects, according to the operation selection signal nclk, the output from the selector 145 or the output from the selector 146, and outputs it to the second filter output unit 500.

The first coefficient update unit 200 multiplies data that is selectively outputted from the first data selection part 110 by an error value, and adds the multiplication result to an old feedback coefficient for coefficient update. The first coefficient update unit 200 updates, according to the operation selection signal nclk, two coefficients c0, c1 by turns for a clock signal, and outputs the updated coefficients to the first filter output unit 400.

More specifically, in the first coefficient update unit 200 a selector 201 selects real valued error erri or imaginary error errq according to the operation selection signal nclk, and outputs the error to a selector 202. If the mode_sel=0 the selector 202 selects the real valued error erri, and if the mode_sel=1 it selects the output from the selector 201, and outputs the selected one to a multiplier 203. The multiplier 203 multiplies the output from the selector 202 by the output from the selector 116 of the first data selection part 110, and outputs the multiplication result to a gain part 204 and a selector 205. The gain part 204 is used for the operation of a complex valued filter. The gain part 204 multiples the output from the multiplier 203 by a constant A to compensate its size, and outputs the result to the selector 205. If the mode_sel=0 the selector 205 selects the output from the multiplier 203, and if the mode_sel=1 it selects the output from the gain part 204, and outputs the selected one to an adder 206. The adder 206 adds the output from the selector 205 to the old feedback coefficient, and outputs the result to a saturator 207.

The saturator 207 saturates the output from the adder 206, and outputs the saturated output to delays 212, 213 for use in coefficient storage. The saturator 207 includes a selector 208, a code extractor 209, a comparer 210, and a selector 211. The code extractor 209 extracts a code from the output of the adder 206, and provides the extracted code to the selector 211 as a selection signal. The comparer 210 squares the output from the adder 206, compares the squared value with a constant B, and provides the comparison result to the selector 208 as a selection signal. The selector 211 selects, according to the extracted code by the code extractor 209, a positive constant B or a negative constant −B, and outputs the selected value to the selector 208. The selector 208 selects the output from the adder 206 or the output from the selector 211 on the basis of the comparison result outputted from the comparer 210, and outputs the selected value to the delays 212, 213. The clk2 is a clock with a phase difference of ½ from the clk. The delay 213 synchronizes the output from the selector 208 with the clk, stores the signal and outputs the synchronized signal to selectors 214, 215, and an adder 218, respectively. The adder 218 adds the feedback signals from the delays 212, 213, respectively, and outputs the result to the selector 219. The selector 219 selects, according to the operation selection signal nclk, '0' or the output from the adder 218, and outputs the selected value to the selector 217. If the mode_sel=0 the selector 217 selects the feedback signal from the selector 214, and if the mode_sel=1 it selects the output from the selector 219, and feedbacks the selected one to the adder 206 as an old coefficient. The selector 215 selects, according to the operation selection signal nclk, the output from the selector 214 or the output from the delay 213, and outputs the selected one to the gain part 216. The gain part 216 divides the output from the selector 215 by a constant C, and outputs the result to the first filter output unit 400.

The first filter output unit 400 includes a multiplier 401 that multiplies the updated coefficient from the first coefficient update unit 200 by the output from the second data selection part 120, and a delay 402 that synchronizes the output from the multiplier 401 with clk1, and stores and outputs the value. Here, the clk1 is a clock with a phase difference of ¼ from the clk. Meanwhile, two values y0, y1 are outputted from the first filter output unit 400. The y0 is the output value of the delay 402 after delaying the output from the multiplier 401, and the y1 is the output value of the multiplier 401. These two values y0, y1 have different meanings depending on the functions of a filter.

The second coefficient update unit 300 multiplies data that is selectively outputted from the third selection part 130 by an error value, and adds the multiplication result to an old feedback coefficient for coefficient update. Also, the second coefficient update unit 300 updates, according to the operation selection signal nclk, two coefficients c1, c2 by turns for a clock signal, and outputs the updated coefficients to the second filter output unit 500.

More specifically, in the second coefficient update unit 300 a selector 301 selects real valued error erri or imaginary error errq according to the operation selection signal nclk, and outputs the error to a selector 302. If the mode_sel=0 the selector 302 selects the real valued error erri, and if the mode_sel=1 it selects the output from the selector 301, and outputs the selected one to a multiplier 303. The multiplier 203 multiplies the output from the selector 302 by the output from the selector 137 of the third data selection part 130, and outputs the multiplication result to a gain part 304 and a selector 305. The gain part 304 is used for the operation of a complex valued filter. The gain part 304 multiples the output from the multiplier 303 by the constant A to compensate its size, and outputs the result to the selector 305. If the mode_sel=0 the selector 305 selects the output from the multiplier 303, and if the mode_sel=1 it selects the output from the gain part 304, and outputs the selected one to an adder 306. The adder 306 adds the output from the selector 305 to the old feedback coefficient, and outputs the result to a saturator 307.

The saturator 307 saturates the output from the adder 306, and outputs the saturated output to delays 312, 313 for use in coefficient storage. The saturator 307 includes a selector 308, a code extractor 309, a comparer 310, and a selector 311. The code extractor 309 extracts a code from the output of the adder 306, and provides the extracted code to the selector 311 as a selection signal. The comparer 310 squares the output from the adder 306, compares the squared value with the constant B, and provides the comparison result to the selector 308 as a selection signal. The selector 311 selects, according to the extracted code by the code extractor 309, a positive constant B or a negative constant −B, and outputs the selected value to the selector 308. The selector 308 selects the output from the adder 306 or the output from the selector 311 on the basis of the comparison result outputted from the comparer 310, and outputs the selected value to the delays 312, 313. The clk2 is a clock with a phase difference of ½ from the clk. The delay 313 synchronizes the output from the selector 308 with the clk, stores the signal and outputs the synchronized signal to selectors 314, 315, and a subtracter 318, respectively. The subtracter 318 computes a difference of the feedback signals from the delays 312, 313, respectively, and outputs the difference value to the selector 319. The selector 319 selects, according to the operation selection signal nclk, '0' or the output from the subtracter 318, and outputs the selected value to the selector 317. If the mode_sel=0 the selector 317 selects the feedback signal from the selector 314, and if the mode_sel=1 it selects the output from the selector 319, and feedbacks the selected one to the adder 306 as an old coefficient. The selector 315 selects, according to the operation selection signal nclk, the output from the selector 314 or the output from the delay 313, and outputs the selected one to the gain part 316. The gain part 316 divides the output from the selector 315 by the constant C, and outputs the result to the second filter output unit 500.

The second filter output unit 500 includes a multiplier 501 that multiplies the updated coefficient from the second coefficient update unit 300 by the output from the fourth data selection part 140, and a delay 502 that synchronizes the output from the multiplier 501 with clk1, stores and outputs the value. Here, the clk1 is a clock with a phase difference of ¼ from the clk. Meanwhile, two values y2, y3 are outputted from the second filter output unit 500. The y2 is the output value of the delay 502 after delaying the output from the multiplier 501, and the y3 is the output value of the multiplier 501. These two values y2, y3 have different meanings depending on the functions of a filter.

Here, the third data selection part 130 can be shared with the first data selection part 110. In other words, since the output xdio from the delay 111 of the first data selection part 110, and the output xdio from the delay 134 of the third data selection part 130 are identical, the first and the third data selection part 110, 130 can use only one of those two signals. Similarly, the output xdqo from the delay 113 of the first data selection part 110 and the output xdqo from the delay 132 of the third data selection part 130 are identical, the first and the third data selection part 110, 130 can use only one of those two signals. For example, the selector 135 of the third data selection part 130 can receive the output xdqo from the delay 113 of the first data selection part 110 instead of the delay 132. Also, the delay 136 of the third data selection part 130 can receive the output xdio from the delay 111 of the first data selection part 110 instead of the delay 134. In this case, the delays 132, 134 and the selectors 131, 133 of the third data selection part 130 become unnecessary.

For convenience of the explanation, it is assumed that the second coefficient update unit 300 performs the coefficient update by using the delays 132, 134 and the selectors 131, 133 of the third data selection part 130.

In FIG. 1, the mode_sel is a signal for deciding the mode of the digital filter, i.e., 4-tap real valued filter mode or 1-tap complex valued filter mode. In the present invention if the mode_sel=0 it indicates the real valued filter mode, and if the mode_sel=1 it indicates the complex valued filter mode.

Figure 2:
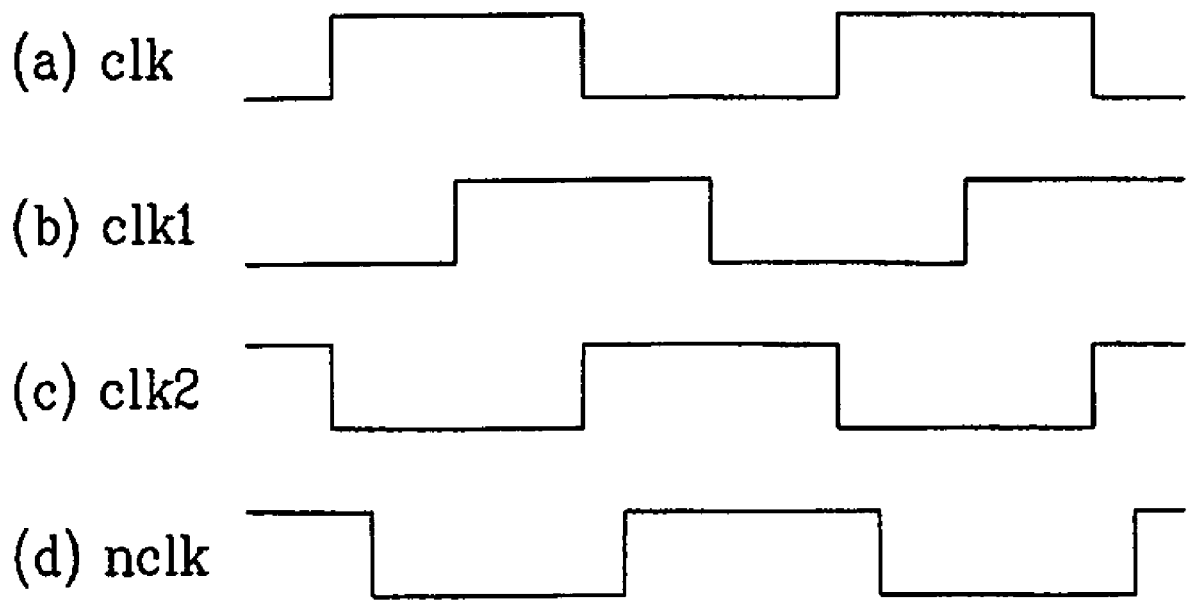
FIG. 2 diagrammatically illustrates phase relations in clocks and selection signal used in a digital filter architecture of the present invention.

FIG. 2 diagrammatically illustrates phase relations in clocks and selection signal used in a digital filter architecture of the present invention. Referring to FIG. 2, clk in (a) is a symbol clock, i.e., a time period signal; clk1 in (b) is a clock with a phase difference of ¼ period from the clk; and clk2 in (c) is a clock with a phase difference of ½ period from the clk. Meanwhile, nclk in (d) is an operation selection signal that has the same waveform with the clk2 but is time delayed a little bit. The reason for using the nclk as a selection control signal among the selectors of FIG. 1 is to make it possible for each operator in the digital filter of the present invention to perform the operation twice for a symbol clock.

Also, it is assumed that the mode selection signal mode_sel and each clock (i.e., clk, clk1, clk2, nclk) are generated by a control unit (not shown) and are provided to the digital filter of the present invention.

The following will now explain the operation of the digital filter in FIG. 1 in the 4-tap real valued filter mode and the 1-tap complex valued filter mode, respectively.

Figure 3A:
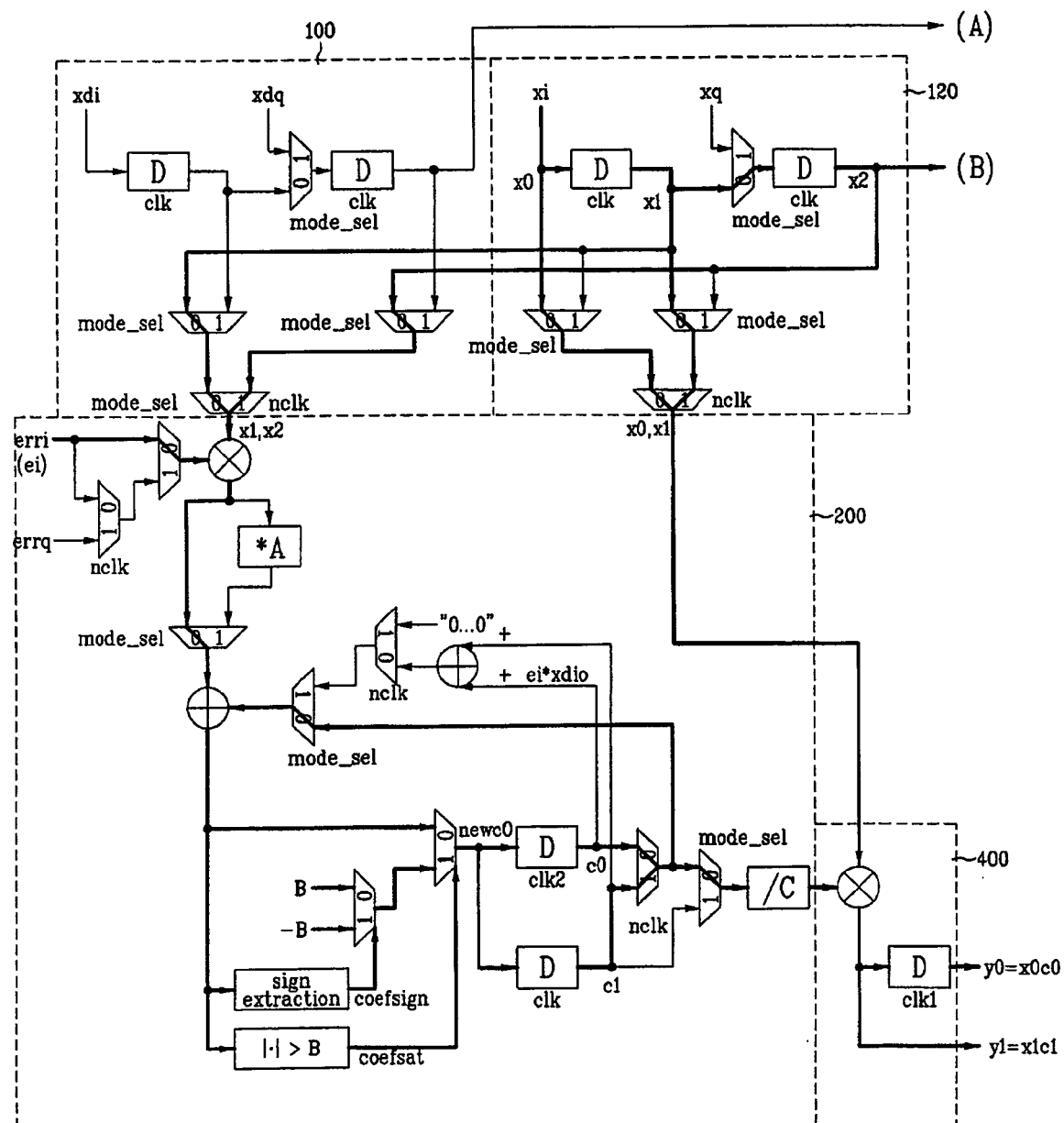
FIG. 3A and FIG. 3B are schematic block diagrams of the digital filter in FIG. 1, in which a thick solid line in each figure represents a signal flow when the digital filter is operated as a 4-tap real valued filter.
Figure 3B:
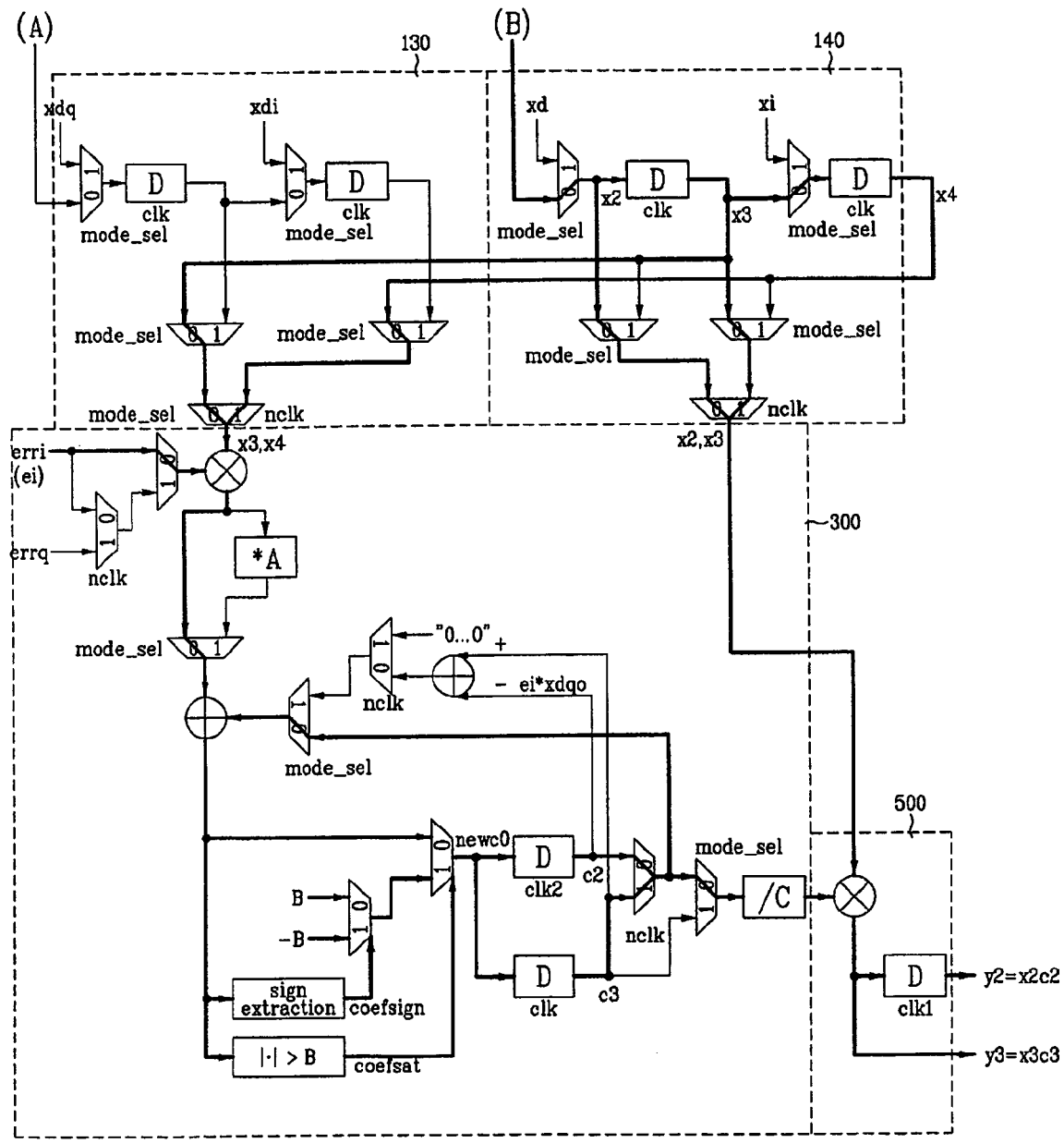

FIG. 3A and FIG. 3B are schematic block diagrams of the digital filter in FIG. 1, in which a thick solid line in each figure represents a signal flow when the digital filter is operated as a 4-tap real valued filter. At this time the mode-sel equals to '0'.

Figure 4:
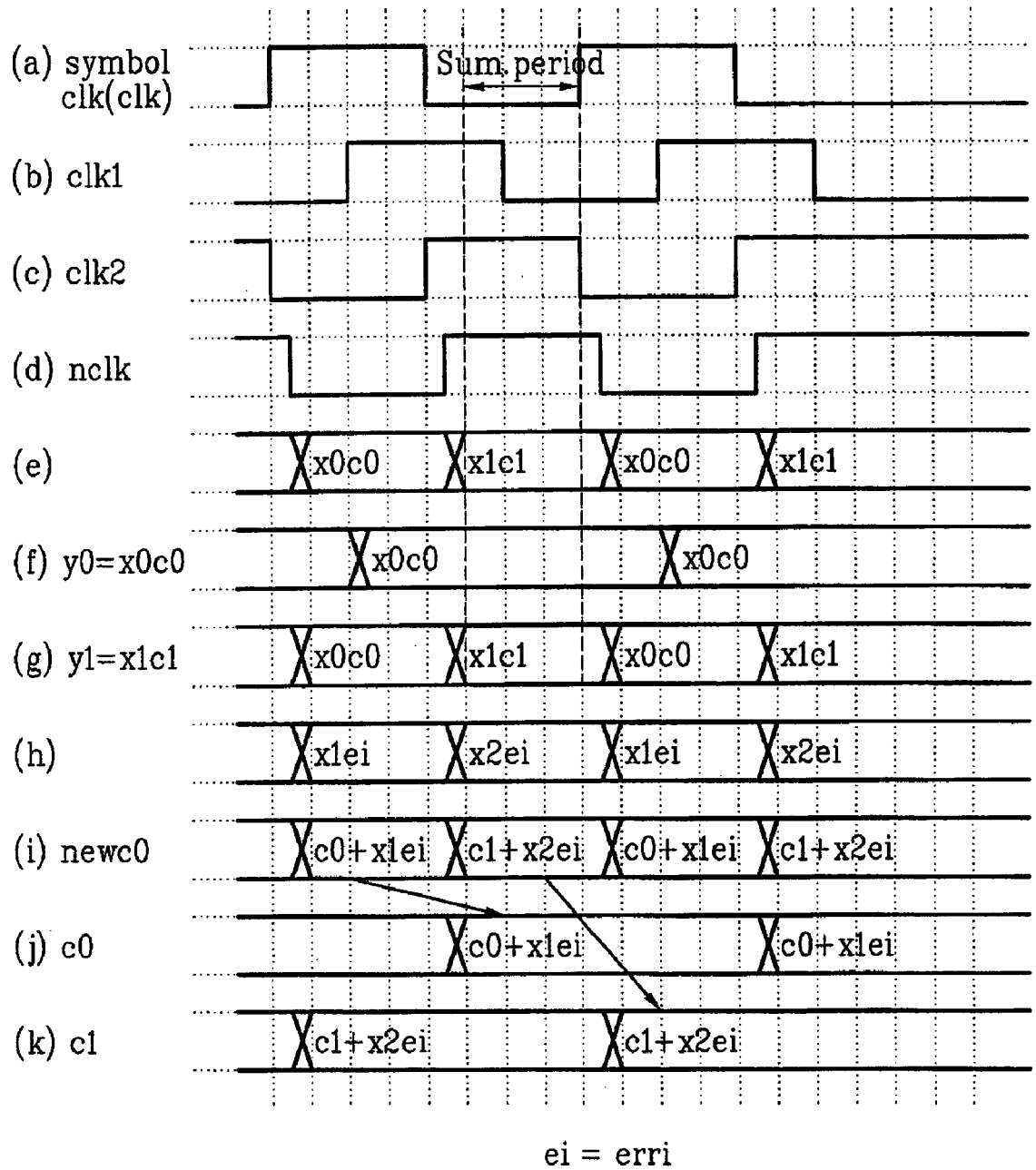
FIG. 4 illustrates operation timing diagrams of each unit in FIG. 3A.

FIG. 4 illustrates operation timing diagrams of each unit in FIG. 3A. Operation timing diagrams for FIG. 3B are basically the same with those in FIG. 4, except for the difference in an output value due to the difference in an input value. Referring to FIG. 4, clk in (a) is a symbol clock, i.e., a time period; clk1 in (b) is a clock with a phase difference of ¼ period from the clk; and clk2 in (c) is a clock with a phase difference of ½ period from the clk. Meanwhile, nclk in (d) is an operation selection signal that has the same waveform with the clk2 but is time delayed a little bit. As can be seen in FIG. 4, the constant operation values (that is, A, B and C) are not indicated.

That is, when the mode_sel=0, the delays 201, 203, 142, 144 of the second and the fourth data selection parts 120, 140 of the data input unit 100 synchronize the input data xi with the clk and sequentially delays the data x1~x4. Since the mode_sel=0, each selector 114, 115, 122, 124, 125, 141, 143, 145, 146 of the first to fourth data selection parts selects the signal inputted to the '0' input terminal, and outputs the selected signal through the output terminal. This process is equally applied to the selectors among the ones shown in FIGS. 3A and 3B which use the mode_sel as their selection signals.

Therefore, the input signal xi(=x0) of the delay 201 is outputted to the selector 126 through the selector 124.

The output signal x1 of the delay 201 is outputted, through the selector 122, to the delay 123 to be delayed. Then the delayed signal is outputted to the selector 126 through the selector 126, and then to the selector 116 through the selector 114 of the first data selection part 110.

The output signal x2 of the delay is outputted to the selector 116 through the selector 115 of the first data selection part 110 and then to the delay 142 through the selector 141 of the fourth data selection part 140. Also, the output from the selector 141 is outputted to the selector 147 through the selector 145.

The output signal x3 of the delay 142 is outputted, through the selector 143, to the delay 144 to be delayed. Then the delayed signal is outputted to the selector 147 through the selector 146, and then to the selector 137 through the selector 135 of the third data selection part 130.

The output signal x4 of the delay 144 is outputted to the selector 137 through the selector 136 of the third data selection part 130.

The selectors 116, 126, 137, 147 of the first to fourth data selection parts 110~140 are the selectors that selectively output the input signal according to the operation selection signal nclk.

The operation selection signal nclk has the same waveform with the clk2 in FIG. 2(a) but is time delayed a little bit. The nclk is used so that each operator in the digital filter of the present invention can perform the operation twice within one symbol clock. In other words, two outputs are obtained by using one operator twice for a clk.

Therefore, if the nclk=0 the selector 116 of the first data selection part 110 selects the output x1 from the selector 114, and if the nclk=1 the selector 116 of the first data selection part 110 selects the output x2 from the selector 115, and outputs the selected one to the multiplier 203 of the first coefficient update unit 200.

Also, if the nclk=0 the selector 137 of the third data selection part 130 selects the output x3 from the selector 135, and if the nclk=1 the selector 137 of the third data selection part 130 selects the output x4 from the selector 136, and outputs the selected one to the multiplier 303 of the second coefficient update unit 300.

Further, if the nclk=0 the selector 126 of the second data selection part 120 selects the output x0 from the selector 124, and if the nclk=1 the selector 126 of the second data selection part 120 selects the output x1 from the selector 125, and outputs the selected one to the multiplier 401 of the first filter output unit 400.

Lastly, if the nclk=0 the selector 147 of the fourth data selection part 140 selects the output x2 from the selector 145, and if the nclk=1 the selector 147 of the fourth data selection part 140 selects the output x3 from the selector 146, and outputs the selected one to the multiplier 501 of the second filter output unit 500.

Provided that the digital filter of the present invention is operated as the real valued filter, that is, if the mode_sel=0, the coefficient update equations for each tap used by the first and the second coefficient update unit 200, 300 are provided in Equation 1 below.

$$c0(n+1)=c0(n)+x1(n)*erri(n)$$
$$c1(n+1)=c1(n)+x2(n)*erri(n)$$
$$c2(n+1)=c2(n)+x3(n)*erri(n)$$
$$c3(n+1)=c3(n)+x4(n)*erri(n)$$
[Equation 1]

wherein, $x1(n)$, $x2(n)$, $x3(n)$ and $x4(n)$ are generated when the real valued input xi is synchronized four times with the clk by the symbol clock delays 121, 123, 142, 144 of the data input unit 100 and delayed sequentially. And, $c0(n)$, $c1(n)$, $c2(n)$ and $c3(n)$ are filter coefficients at present clock period; $c0(n+1)$, $c1(n+1)$, $c2(n+1)$ and $c3(n+1)$ are filter coefficients of a next clock period, i.e., updated filter coefficients; and erri(n) is an error value.

In other words, as shown in FIG. 4(h), if the nclk=0 the multiplier 203 of the first coefficient update unit 200 multiplies the selected output signal x1 from the first data selection part 110 by the real valued error erri, and outputs the multiplication result (x1*erri) to the adder 206 through the selector 205, and if the nclk=0 the multiplier 203 of the first coefficient update unit 200 multiplies the output signal x2 by the real valued error erri, and outputs the multiplication result (x2*erri) to the adder 206 through the selector 205. The real valued error erri is provided to the multiplier 203 through the selector 202.

The adder 206, as shown in FIG. 4(i), adds the output value from the selector 205 and the old feedback coefficient for coefficient update, and outputs the updated coefficient to the saturator 207.

If the output from the adder 206 is saturated greater than a predetermined value the saturator 207 limits the output within the predetermined value (for example, B or −B), but if the output from the adder 206 is not saturated the saturator 207 outputs the output from the 206 as it is. To this end, the code extractor 209 extracts a code from the output of the adder 206, and outputs the code as the selection signal for the selector 211. If the extracted code is plus (+) the selector 211 selects the positive constant B, and if the extracted code is minus (−) the selector 211 selects the negative constant −B, and outputs the selected constant to the selector 208. In addition, the comparer 210 takes the absolute value of the output from the adder 206, and compares the absolute value with the constant B. The comparison result is then outputted to the selector 208. Based on the comparison result provided by the comparer 210, if the absolute value is greater than the constant B the selector 208 selects the output from the selector 211, but if not the selector 208 selects the output from the adder 206, and outputs the selected one to the delays 212, 213.

The delay 212, as shown in FIG. 4(j), is synchronized with the clk2, stores the output from the saturator 207, and outputs it to the selector 214 as the coefficient c0(=c0+x1erri). Similarly, the delay 213, as shown in FIG. 4(k), is synchronized with the clk, stores the output from the saturator 207, and outputs it to the selector 214 as the coefficient c1(=c1+x2erri).

If the nclk=0 the selector 214 selects the coefficient c0, and if the nclk=1 the selector 214 selects the coefficient c1, and outputs the selected one simultaneously to the gain part 216 through the selector 215 and to the adder 206 through the selector 217. That is, if the nclk=0 the adder 206 adds the output x1*erri from the selector 205 to the old coefficient c0 that is feedbacked through the selector 217, thereby updating the coefficient c0. Also, if the nclk=1 the adder 206 adds the output x2*erri from the selector 205 to the old coefficient c1 that is feedbacked through the selector 217, thereby updating the coefficient c1.

Meanwhile, the gain part 216 divides the updated coefficient c0 or c1 outputted from the selector 215 by the constant C, and outputs the result to the multiplier 401 of the first filter output unit 400. The multiplier 401, as shown in FIG. 4(e), multiplies the output from the gain part 216 by the selected output data from the selector 126 of the second data selection part 120, and outputs the multiplication result as it is and at the same time the multiplication result is outputted through the delay 402 operating synchronously with the clk1. In other words, if the nclk=0 the multiplier 401 multiplies the coefficient c0 from the gain part 216 by the selected output x0 from the selector 126, and if the nclk=0 the multiplier 401 multiplies the c1/C (which is obtained by dividing the coefficient c1 from the gain part 216 by the constant C) by the selected output x1 from the selector 126, and outputs the multiplication result. For convenience's sake, the constant C is not explained in the drawings as well as the following description.

The multiplication result from the multiplier 401 is outputted as it is and is outputted through the delay 402 at the same time. The delay 402, being synchronized with the clk1, and stores and outputs the output from the multiplier 401. The clk1 in FIG. 2(b) is a clock with a phase difference of ¼ period from the clk. That is, $x0*c0$ in FIG. 4(f) from the multiplier 401 is outputted through the delay 402 as y0 ($y0=x0*c0$), and $x1*c1$ in FIG. 4(g) from the multiplier 401 is outputted as y1 without going through the delay 402 ($y1=x1*c1$)

As such, those two tap outputs y0, y1 are obtained within a clock period clk. That is to say, using an operator (or a selector receiving the operation selection signal as the selection signal) twice it becomes possible to get two outputs within a clock period (clk).

The aforementioned procedure performed by the first coefficient update unit 200 and the first filter output unit 400 is equally applied to the second coefficient update unit and the second filter output unit 500, which update the tap coefficients c2, c3 and obtain the outputs y2, y3, respectively.

If the digital filter of the present invention is in the real valued filter mode, the first coefficient update unit 200 and the second coefficient update unit 300 perform the identical coefficient update procedure, except that each receives a different input signal from the data input unit 100. Namely, if the nclk=0 the multiplier 303 of the second coefficient update unit 300 multiplies the selected output data x2 from the third data selection part 130 by the real valued error erri, and if the nclk=1 the multiplier 303 of the second coefficient update unit 300 multiplies the selected output data x3 from the third data selection part 130 by the real valued error erri, and outputs the multiplication result. The procedure hereinafter is identical with that of the first coefficient update unit 200, so it will not be fully discussed here.

Similarly, if the digital filter of the present invention is in the real valued filter mode, the first filter output unit 400 and the second filter output unit 500 perform the identical tap coefficient output procedure, except that each receives a different input signal from the data input unit 100. Namely, if the nclk=0 the multiplier 501 of the second filter output unit 500 multiplies the updated coefficient c2 outputted from the second coefficient update unit 300 by the selected output data x2 from the selector 147 of the fourth data selection part 140, and outputs the multiplication result ($x2*c2$), and if the nclk=1 the multiplier 501 of the second filter output unit 500 multiplies the updated coefficient c3 outputted from the second coefficient update unit 300 by the selected output data x3 from the selector 147 of the fourth data selection part 140, and outputs the multiplication result ($x3*c3$). Here, the multiplication result $x2*c2$ from the multiplier 501 is outputted through the delay 502 as y2 ($y2=x2*c2$), and the multiplication result $x3*c3$ from the multiplier 501 is outputted through the delay 502 as y3 ($y3=x3*c3$).

In the real valued filter mode, four tap outputs y0~y3 from the first and the second filter output unit 400, 500 are shown in Equation 2 below.

$$y0=x0*c0$$
$$y1=x1*c1$$
$$y2=x2*c2$$
$$y3=x3*c3$$

[Equation 2]

wherein x0 is an input signal x1, and x1, x2 and x3 are generated when the real valued input x1 is synchronized three times with the clk by the symbol clock delays 121, 123, 142 of the data input unit 100 and delayed sequentially. And, c0, c1, c2 and c3 are updated tap coefficients.

The sum of the filter outputs y0~y3 can be obtained in the summation period shown in FIG. 4(a).

Therefore, when the mode_sel=0 the digital filter of the present invention is operated as the 4-tap real valued filter with 4 tap outputs.

Figure 5A:
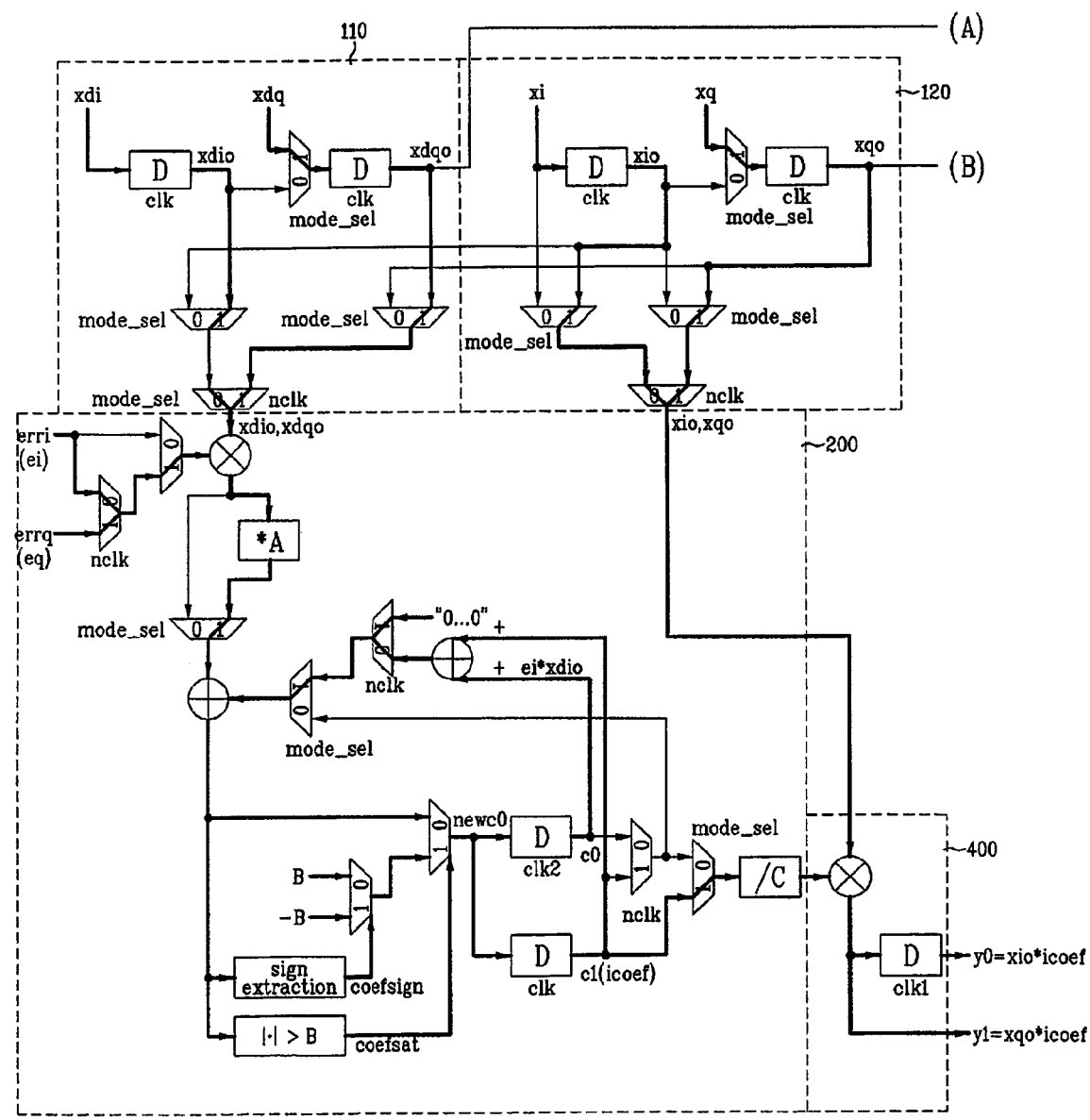
FIG. 5A and FIG. 5B are schematic block diagrams of the digital filter in FIG. 1, in which a thick solid line in each figure represents a signal flow when the digital filter is operated as a 1-tap complex valued filter.
Figure 5B:
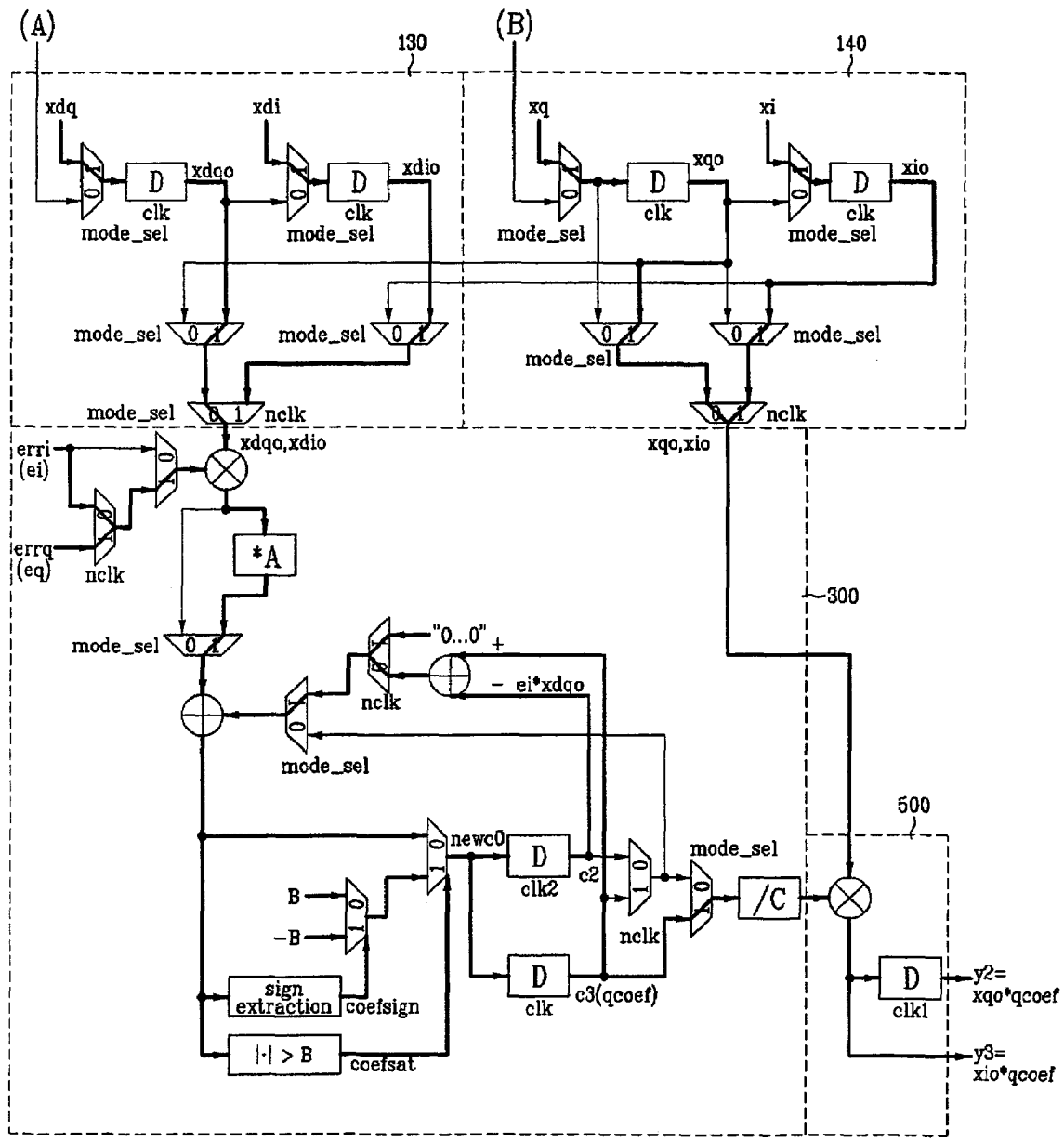

FIG. 5A and FIG. 5B are schematic block diagrams of the digital filter in FIG. 1, in which a thick solid line in each figure represents a signal flow when the digital filter is operated as a 1-tap complex valued filter. At this time the mode_sel equals to '1'.

Figure 6:
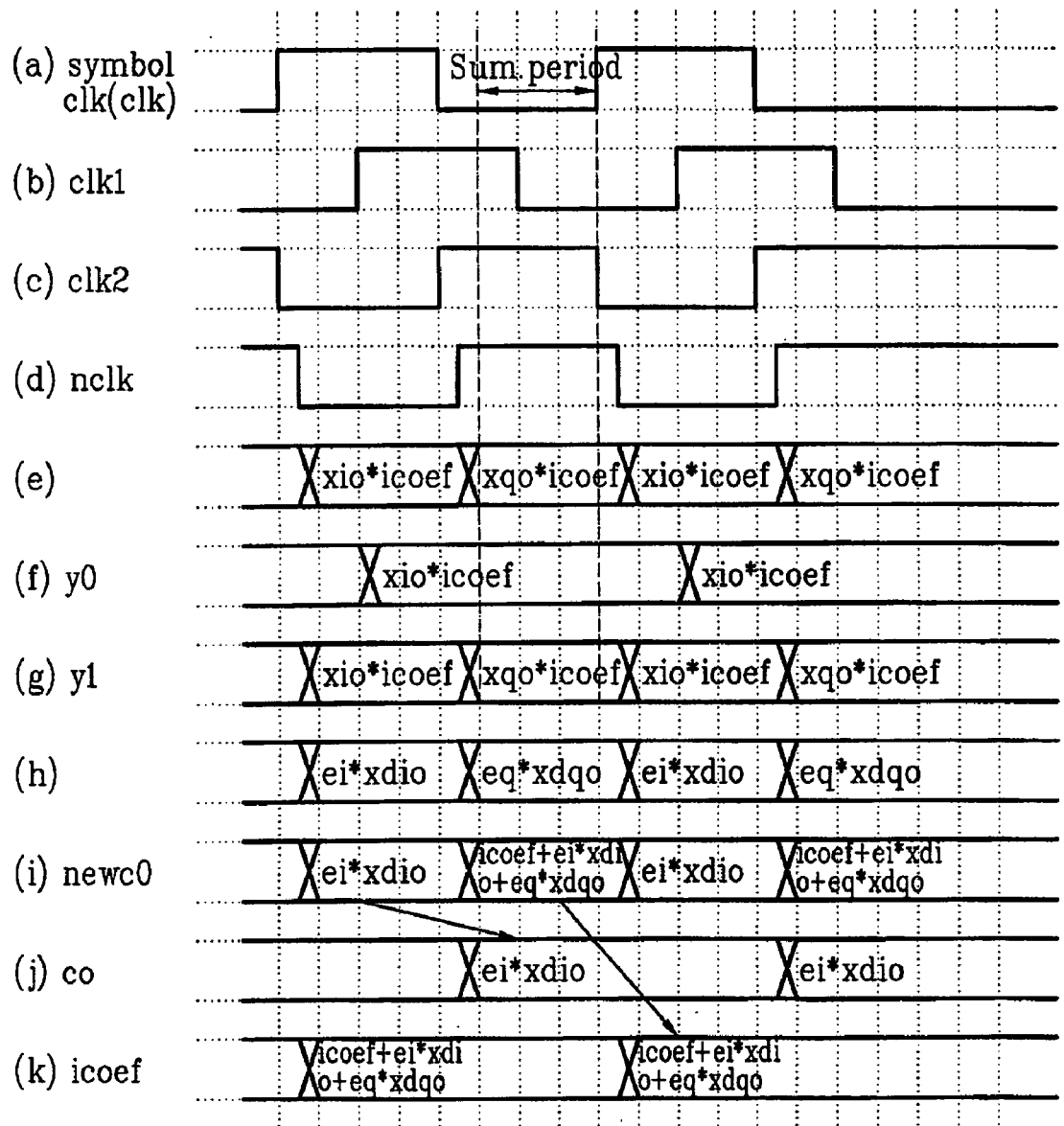
FIG. 6 illustrates Operation timing diagrams of each unit in FIG. 5A.

FIG. 6 illustrates operation timing diagrams of each unit in FIG. 5A. Operation timing diagrams for FIG. 5B are basically the same with those in FIG. 6, except for the difference in an output value due to the difference in an input value. Since the clocks shown in FIG. 6(a) to (d) are identical with those in FIG. 4(a) to (d) and described already, no further details will be provided here. Also, the constant operation values (that is, A, B and C) are not indicated in FIG. 6, either.

In the complex valued filter mode, both real valued input and imaginary valued input are necessary. Since the mode_sel=0, each selector 114, 115, 122, 124, 125, 141, 143, 145, 146 of the first to fourth data selection parts 110~140 selects the signal inputted to the '1' input terminal, and outputs the selected signal through the output terminal. This process is equally applied to the selectors among the ones shown in FIGS. 5A and 5B which use the mode_sel as their selection signals. Each of the selectors 114, 115, 122, 124, 125, 141, 143, 145, 146 of the first to fourth data selection parts 110~140 synchronizes its input data with the clk and then outputs the data.

Therefore, delayed real valued data xdi is inputted to the delay 111 of the first data selection part 110, and to the delay 134 through the selector 133 of the third data selection part 130 to be delayed by a clk.

Delayed imaginary data xdq, on the other hand, is inputted to the delay 113 through the selector 112 of the first data selection part 110, and to the delay 132 through the selector 131 of the third data selection part 130 to be delayed by a clk.

Input real valued data xi is inputted to the delay 121 of the second data selection part 120, and to the delay 144 through the selector 143 of the fourth data selection part 140 to be delayed by a clk.

Input imaginary data xq is inputted to the delay 123 through the selector 122 of the second data selection part 120, and to the delay 142 through the selector 141 of the fourth data selection part 140 to be delayed by a clk.

The output xdio from the delay 111 of the first data selection part 110 is outputted to the selector 116 through the selector 114, and the output xdqo from the delay 112 is outputted to the selector 116 through the selector 115. If the nclk=0 the selector 116 selects the output xdio from the selector 114, and if the nclk=1 the selector 116 selects the output xdqo from the selector 115 and outputs it to the multiplier 203 of the first coefficient update unit 200.

The output xio from the delay 121 of the second data selection part 120 is outputted to the selector 126 through the selector 124, and the output xqo from the delay 123 is outputted to the selector 126 through the selector 125. If the nclk=0 the selector 126 selects the output xio from the selector 124, and if the nclk=1 the selector 126 selects the output xqo from the selector 125 and outputs it to the multiplier 401 of the first filter output unit 400.

The output xdqo from the delay 132 of the third data selection part 130 is outputted to the selector 137 through the selector 135, and the output xdio from the delay 134 is outputted to the selector 137 through the selector 136. If the nclk=0 the selector 137 selects the output xdqo from the selector 135, and if the nclk=1 the selector 137 selects the output xdio from the selector 136 and outputs it to the multiplier 303 of the second coefficient update unit 300.

The output xqo from the delay 140 of the fourth data selection part 140 is outputted to the selector 147 through the selector 145, and the output xio from the delay 144 is outputted to the selector 147 through the selector 146. If the nclk=0 the selector 147 selects the output xqo from the selector 145, and if the nclk=1 the selector 147 selects the output xio from the selector 146 and outputs it to the multiplier 501 of the second filter output unit 500.

The first and third data selection parts 110, 130 of the data input unit 100 receive real valued and imaginary valued data xdi, xdq, respectively, and generate output data xdio, xdqo that are delayed by one clock period or symbol clock. In the same way, the second and fourth data selection parts 120, 140 receive the same real valued and imaginary valued data xi, xq, and generate output data xio, xqo that are delayed by one clock period. Therefore, the first and second coefficient update units 200, 300 can receive data from the first and third data selection parts 110, 130, respectively, or from the first data selection part 110 only, or from the third data selection part 130 only. This will be different depending on how the digital filter is designed.

In the exemplary embodiment of the present invention, it is assumed that the first coefficient update unit 200 receives data from the first data selection part 110, and the second coefficient update unit 300 receives data from the third data selection part 130.

Also, if the digital filter of the present invention is in the complex valued filter mode, that is, if the mode_sel=1 the coefficient update equations for each tap used by the first and the second coefficient update unit 200, 300 are provided in Equation 3 below. Since the coefficients are complex values, the operation is divided into two: real coefficient parts and imaginary coefficient parts.

Real coefficient: $icoef(n+1)=erri*xdio+errq*xdqo+icoef(n)$; and

Imaginary coefficient: $qcoef(n+1)=-erri*xdqo+errq*xdio+qcoef(n)$  [Equation 3]

In the digital filter architecture shown in FIG. 1, the c1 of the real valued filter corresponds to the real coefficient icoef of the complex valued filter, and the c3 of the real valued filter corresponds to the imaginary coefficient qcoef of the complex valued filter.

In the Equation 3, erri indicates a real valued error; errq indicates an imaginary error; xdio is a delayed xdi by one symbol clock; and xdqo is a delayed xdq by one symbol clock. The icoef(n) and the qcoef(n) are filter coefficients at present clock period; and the icoef(n+1) and the qcoef(n+1) are filter coefficients of a next clock period, i.e., updated filter coefficients.

Referring to FIG. 6(h), if the nclk=0 the multiplier 203 of the first coefficient update unit 200 multiplies the selected real valued signal xdio from the first data selection part 110 by the real valued error erri, and outputs the multiplication result (xdio*erri) to the gain part 204. The gain part 204 multiplies the xdio*erri by A (a constant), and outputs the result (xdio*erri*A) to the adder 206 through the selector 205. Also, if the nclk=0 the multiplier 203 multiplies the selected imaginary valued signal xdqo from the first data selection part 110 by the imaginary valued error errq, and outputs the multiplication result (xdqo*erri) to the gain part 204. The gain part 204 multiplies the xdqo*erri by A, and outputs the result (xdqo*erri*A) to the adder 206 through the selector 205. To this end, the selector 201 selects the real valued error erri if the nclk=0, and the imaginary valued error errq if the nclk=1, and outputs the selected error to the multiplier 203 through the selector 202. Here, the A is a constant for compensating the scale.

The adder 206, as shown in FIG. 6(i), adds the output value from the selector 205 and the old feedback coefficient for coefficient update, and outputs the updated coefficient to the saturator 207.

The saturator 207 takes the absolute value of the output from the adder 206, and if absolute value is greater than a predetermined value (for example, B), it limits the output within the predetermined value (for example, B or −B), but if not the saturator 207 outputs the output from the 206 as it is to the delays 212, 213. Since the function of the saturator 207 was already described with reference to the 4-tap real valued filter and is identical with that of the saturator for use in the 1-tap complex valued filter, no detail will be provided here.

The delay 212, being synchronized with the clk2, stores the output from the saturator 207, and feedbacks it to the adder 218. Similarly, the delay 213, being synchronized with the clk, stores the output from the saturator 207, and feedbacks it to the adder 218. The adder 218 adds the coefficients outputted from the delays 212, 213 together, and outputs the result to the selector 219. At this time, the output from the delay 213 is the real coefficient icoef, which is later outputted to the multiplier 401 of the first filter output unit 400 through the selector 215 and the gain part 216.

If the nclk=0 the selector 219 selects '0', and if the nclk=1 the selector 219 selects the output from the adder 218, and outputs it to the adder 206 through the selector 217.

Namely, the adder 218 adds the coefficient xdio*erri outputted from the delay 212 shown in FIG. 6(j) and the old real coefficient icoef outputted from the delay 213 shown in FIG. 6(k). If the input operation selection signal to the selector 219 is 1, that is, if the nclk=1, the selectors 218, 217 output the sum (i.e., xdio*erri+icoef) to the adder 206. If the nclk=0 the selector 219 selects '0' and outputs it to the adder 206 through the selector 217. Provided that the nclk=0 the adder 206 then outputs the xdio*erri from the multiplier 203 to the saturator 207 as it is. Meanwhile, if the nclk=1 the adder 206 adds the xdio*erri+icoef from the selector 217 to the output xdiq*errq from the multiplier 203, and outputs the result to the saturator 207. At this time the output value of the saturator 207 is the updated coefficient newc0, as shown in FIG. 6(i). Updating coefficients also means updating complex valued coefficients. Therefore, the xdio*erri among the updated coefficients newc0 is outputted as FIG. 6(j) through the delay 212 operating synchronously with the clk2, and the icoef+xdio*erri+xdqo*errq is outputted as FIG. 6(k) through the delay 213 operating synchronously with the clk. Next, the output values from the delays 212, 213 are feedbacked to the adder 218.

As for the 1-tap complex valued filter, only two out of four coefficients of the 4-tap real valued filter are used as effective coefficient. For instance, the c1 in FIG. 3A is used as a real coefficient icoef, and the c3 in FIG. 3B is used as an imaginary coefficient qcoef. The real coefficient icoef goes through the selector 215 and the gain part 216 and is outputted to the multiplier 401 of the first filter output unit 400. The imaginary coefficient qcoef goes through the selector 315 and the gain part 316 and is outputted to the multiplier 501 of the second filter output unit 500.

The multiplier 401, as shown in FIG. 6(e), multiplies the real coefficient icoef outputted from the gain part 216 by the selected output data (xio or xqo) from the selector 126 of the second data selection part 120. The multiplication result is outputted as it is, and simultaneously through the delay 402 operating synchronously with the clk1. The delay 402, which is synchronized with the clk1, delays the output from the multiplier 401 and outputs it. Therefore, if the nclk=0 the multiplier 401 multiplies the real coefficient icoef that is outputted from the gain part 216 by the real valued data xio that is selectively outputted from the selector 126, and if the nclk=1 the multiplier 401 multiplies the real coefficient icoef that is outputted from the gain part 216 by the imaginary valued data xqo that is selectively outputted from the selector 126, and outputs the multiplication result. For convenience's sake, the constant C of the gain part 216 is not explained in the drawings as well as the following description.

In addition, if the nclk=0 the output xio*icoef from the multiplier 401 is outputted through the delay 402 as y0 (y0=xio*icoef) as shown in FIG. 6(f). If the nclk=1 the output xqo*icoef from the multiplier 401 does not go through the delay 402 but is outputted as it is as y1 (y1=xqo*icoef).

As such, those two outputs y0, y1 are obtained within a clock period clk. That is to say, using an operator (or a selector receiving the operation selection signal as the selection signal) twice it becomes possible to get two outputs within a clock period (clk).

The second coefficient update unit 300 and the second filter output unit 500 perform the same procedures used by the first coefficient update unit 200 and the first filter output unit 400 in order to update the imaginary coefficient qcoef and obtain two outputs y2, y3, respectively.

In the complex valued filter mode, the first coefficient update unit 200 and the second coefficient update unit 300 have the same architecture and operations with each other except that each receives a different input signal from the data input unit 100, and the adder 218 of the first coefficient update unit 200 corresponds to the subtracter 318 of the second coefficient update unit 300.

That is, if the nclk=0 the multiplier 303 of the second coefficient update unit 300 multiplies the imaginary valued data xdqo that is selectively outputted from the third data selection part 130 by the real valued error erri, and if the nclk=1 the multiplier 303 of the second coefficient update unit 300 multiplies the real valued data xdio that is selectively outputted from the third data selection part 130 by the imaginary valued error errq, and outputs the multiplication result. In addition, the subtracter 318 subtracts the feedback coefficient xdqo*erri from the delay 312 from the old imaginary coefficient qcoef that is feedbacked by the delay 313, and outputs the result to the adder 306 through the selector 317. The rest of the procedure is the same with that of the first coefficient update unit 200.

Similarly, in the complex valued filter mode, the first filter output unit 400 and the second filter output unit 500 have the same output procedure with each other except that each receives a different input signal. That is, if the nclk=0 the multiplier 501 of the second filter output unit 500 multiplies the updated imaginary coefficient qcoef from the second coefficient update unit 300 by the imaginary valued data xqo that is selectively outputted from the selector 147 of the fourth data selection part 140, and outputs the multiplication result (xqo*qcoef). Also, if the nclk=1 the multiplier 501 of the second filter output unit 500 multiplies the updated imaginary qcoef from the second coefficient update unit 300 by the real valued data xio that is selectively outputted from the selector 147 of the fourth data selection part 140, and outputs the multiplication result (xio*qcoef). At this time, the xqo*qcoef from the multiplier 501 is outputted as the y2 value (y2=xqo*qcoef) through the delay 502, and the xio*qcoef from the multiplier 501 is outputted exactly as the y3 value (y3=xio*qcoef) without going through the delay 502.

When the digital filter of the present invention functions as the 1-tap complex valued filter, the real valued output and the imaginary valued output of the filter, which are outputted through the first and second filter output units 400, 500, respectively, are shown in Equation 4 below.

Real valued output=y0−y2=xio*icoef−xqo*qcoef; and

Imaginary valued output=y1+y3=xqo*icoef+xio*qcoef  [Equation 4]

Wherein, xio is a delayed xi by one symbol clock; xqo is a delayed xq by one symbol clock; icoef is a real coefficient; and qcoef is an imaginary coefficient.

In the summation period in FIG. 6(a), the xio*icoef and the xqo*icoef are outputted simultaneously in the summation period in FIG. 6(a), and the xio*qcoef and the xqo*qcoef are outputted simultaneously. Therefore, by performing y0−y2 and y1+y3 in the summation period, it becomes possible to obtain both the real valued output and the imaginary valued output.

The digital filter of the present invention functions as the 1-tap complex valued filter with one tap output when the mode_sel=1.

In conclusion, the digital filter according to the present invention has a combined architecture of the 4-tap real valued filter and the 1-tap complex valued filter, wherein the filter output is obtained within one symbol clock and one operator performs computations twice for each symbol clock. Thus, the filter size problem often found in the related art LMS adaptive filter with the real valued filter and the complex valued filter can be resolved. In effect, the number of multipliers and adders used in the present invention filter is approximately 69% (18/26) of that of the related art filter.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A digital filter comprising:
a control unit for generating and outputting a mode selection signal through which the operations of a real valued filter and a complex valued filter are determined, and an operation selection signal for controlling corresponding operators perform the operations twice for a symbol clock (clk), the operation selection signal being generated by delaying a clock with a ½ phase difference from the clk by a predetermined time;
a data input unit for selecting an input real valued data and an input imaginary valued data according to the mode selection signal, delaying the data, respectively, selecting the input data and delayed data again according to the mode selection signal and the operation selection signal, and outputting the selected data for coefficient update and filter output;
a first coefficient update unit for multiplying the selected output data from the data input unit by an error value that is selected according to the mode selection signal and the operation selection signal, adding the multiplication result to an old coefficient that is selected according to the mode selection signal and the operation selection signal and thereby, updating two coefficients of the real valued filter and a real coefficient of the complex valued filter within one clock;
a second coefficient update unit for multiplying the selected output data from the data input unit by an error value that is selected according to the mode selection signal and the operation selection signal, adding the multiplication result to an old coefficient that is selected according to the mode selection signal and the operation selection signal and thereby, updating two coefficients of the real valued filter and a real coefficient of the complex valued filter within one clock;
a first filter output unit for multiplying two data selectively outputted from the data input unit for a clock by the two coefficients of the real valued filter or the real coefficient of the complex valued filter provided from the first coefficient update unit and thereby, generating two tap outputs of the real valued filter or two outputs of the complex valued filter; and
a second filter output unit for multiplying two data selectively outputted from the data input unit for a clock by the two coefficients of the real valued filter or the real coefficient of the complex valued filter provided from the second coefficient update unit and thereby, generating two tap outputs of the real valued filter or two outputs of the complex valued filter.

2. The digital filter according to claim 1, wherein the data input unit is comprised of:
a first data selection part for selecting within a clock a delayed real valued data and a delayed imaginary valued data, each being delayed by a predetermined period, according to the mode selection signal, and outputting the selected two data to the first coefficient update unit;
a second data selection pan for delaying a delayless input real valued data and a delayless input imaginary valued, data, respectively, selecting two data among the input data and the delayed data within a clock according to the, mode selection signal and the operation selection signal, and outputting the selected two data to the first filter output unit;
a third data selection part for selecting within a clock a delayed real valued data and a delayed imaginary valued data, each being delayed by a predetermined period, according to the mode selection signal, and outputting the selected two data to the second coefficient update unit; and
a fourth data selection part for delaying a delayless input real valued data, a delayless input imaginary valued data, and input data from the second data selection part, respectively, selecting two data among the input data and the delayed data within a clock according to the mode selection signal and the operation selection signal, and outputting the selected two data to the second filter output unit.

3. The digital filter according to claim 2, wherein the first data selection part is comprised of:
a first delay for delaying a delayed real valued input data synchronously with the clk;
a first selector for selectively outputting, according to the mode selection signal, one of delayed imaginary valued input data and the delayed real valued data provided from the first delay;
a second delay for delaying the output data from the first selector synchronously with the clk;
a second selector for selectively outputting, according to the mode selection signal, one of the output data from the second data selection part and the delayed real valued data provided from the first delay;
a third selector for selectively outputting, according to the mode selection signal, one of the output data from the second data selection part and the delayed data provided from the second delay; and
a fourth selector for sequentially outputting, according to the operation selection signal, the output data from the second and third selectors to the first coefficient update unit for a clk.

4. The digital filter according to claim 1, wherein the second data selection part is comprised of:
a first delay for delaying a delayless real valued input data synchronously with the clk;
a first selector for selectively outputting, according to the mode selection signal, one of delayless imaginary valued input data and the delayed real valued data provided from the first delay;
a second delay for delaying the output data from the first selector synchronously with the clk;
a second selector for selectively outputting, according to the mode selection signal, one of the output data from the second data selection part and the delayed real valued data provided from the first delay;
a third selector for selectively outputting, according to the mode selection signal, one of the delayed data from the first delay and the delayed data from the second delay; and
a fourth selector for sequentially outputting, according to the operation selection signal, the output data from the second and third selectors to the first coefficient update unit for a clk.

5. The digital filter according to claim 2, wherein the third data selection part is comprised of:
a first selector for selectively outputting, according to the mode selection signal, one of delayed imaginary valued input data and the delayed data provided from the second delay of the first data selection part;
a first delay for delaying the output data from the first selector synchronously with the clk;

a second selector for selectively outputting, according to the mode selection signal, one of delayed real valued input data and the delayed real valued data provided from the first delay;

a second delay for delaying the output data from the second selector synchronously with the clk;

a third selector for selectively outputting, according to the mode selection signal, one of the output data from the fourth data selection part and the delayed imaginary valued data provided from the first delay;

a fourth selector for selectively outputting, according to the mode selection signal, one of the output data from the fourth data selection part and the delayed data provided from the second delay; and a fifth selector for sequentially outputting, according to the operation selection signal, the output data from the third and fourth selectors to the second coefficient update unit for a clk.

6. The digital filter according to claim 2, wherein the fourth data selection part is comprised of:

a first selector for selectively outputting, according to the mode selection signal, one of delayless imaginary valued input data and the delayed data provided from the second delay of the second data selection part;

a first delay for delaying the output data from the first selector synchronously with the clk;

a second selector for selectively outputting, according to the mode selection signal, one of delayless real valued input data and the delayed real valued data provided from the first delay;

a second delay for delaying the output data from the second selector synchronously with the clk;

a third selector for selectively outputting, according to the mode selection signal, one of the output data from the first selector and the output data from the first delay;

a fourth selector for selectively outputting, according to the mode selection signal, one of the delayed data from the first delay and the delayed data from the second delay; and a fifth selector for sequentially outputting, according to the operation selection signal, the output data from the third and fourth selectors to the second filter output unit for a clk.

7. The digital filter according to claim 1, wherein the first coefficient update unit is comprised of:

a first selector for sequentially outputting, according to the operation selection signal, a real valued input error and an imaginary valued input error for a clk;

a second selector for selectively outputting, according to the mode selection signal, one of a real valued input error and the output data from the first selector;

a multiplier for multiplying the output data from the first data selection part by the output data from the second selector;

a first gain part for multiplying the output from the multiplier by a gain constant A;

a third selector for selectively outputting, according to the mode selection signal, one of the output data from the multiplier and the output data from the gain part;

a first adder for adding the output data from the third selector to an old feedback coefficient;

a saturator for limiting the addition result of the first adder if the addition result exceeds a predetermined value;

a first delay for delaying the output data from the saturator synchronously with a clk with a ½ phase difference from the clk;

a second delay for delaying the output data from the saturator synchronously with the clk;

a fourth selector for sequentially outputting, according to the operation selection signal, the delayed data from the first and second delays for a clk;

a fifth selector for selectively outputting, according to the mode selection signal, one of the output data from the fourth selector and the output data from the second delay;

a second gain part for dividing the output data from the fifth selector by a gain constant C;

a second adder for adding the output data from the first and the second delay;

a sixth selector for sequentially outputting, according to the operation selection signal, a constant '0' and the output data from the second adder for a clk; and a seventh selector for selecting, according to the mode selection signal, one of the output data from the sixth selector and the output data from the fourth selector, and outputting the selected data to the first adder as an old coefficient.

8. The digital filter according to claim 7, wherein the saturator is comprised of:

a code extractor for extracting a code out of the output data from the first adder;

a comparer for taking an absolute value of the output data from the first adder, and comparing whether the absolute value is greater than a predetermined constant B;

an eighth selector for selecting a positive constant B if a positive code is detected by the code extractor, and selecting a negative constant −B if a negative code is detected by the code extractor; and a ninth selector for outputting the output from the eighth selector if the absolute value is greater than the constant B, and selecting the output from the first adder if the absolute value is greater than the constant B, and outputting the selected value to the first and second delays.

9. The digital filter according to claim 1, wherein the second coefficient update unit is comprised of:

a first selector for sequentially outputting, according to the operation selection signal, a real valued input error and an imaginary valued input error for a clk;

a second selector for selectively outputting, according to the mode selection signal, one of a real valued input error and the output data from the first selector;

a multiplier for multiplying the output data from the third data selection part by the output data from the second selector;

a third gain part for multiplying the output from the multiplier by a gain constant A;

a third selector for selectively outputting, according to the mode selection signal, one of the output data from the multiplier and the output data from the gain part;

an adder for adding the output data from the third selector to an old feedback coefficient;

a saturator for limiting the addition result of the adder if the addition result exceeds a predetermined value;

a first delay for delaying the output data from the saturator synchronously with a clk with a ½ phase difference from the clk;

a second delay for delaying the output data from the saturator synchronously with the clk;

a fourth selector for sequentially outputting, according to the operation selection signal, the delayed data from the first and second delays for a clk;

a fifth selector for selectively outputting, according to the mode selection signal, one of the output data from the fourth selector and the output data from the second delay;

a fourth gain part for dividing the output data from the fifth selector by a gain constant C;

a subtracter for obtaining a difference between the delayed data provided from the first delay and the delayed data provided from the second delay;

a sixth selector for sequentially outputting, according to the operation selection signal, a constant '0' and the output data from the subtracter for a clk; and a seventh selector for selecting, according to the mode selection signal, one of the output data from the sixth selector and the output data from the fourth selector, and outputting the selected data to the adder as an old coefficient.

10. The digital filter according to claim 9, wherein the saturator is comprised of:

a code extractor for extracting a code out of the output data from the adder;

a comparer for taking an absolute value of the output data from the adder, and comparing whether the absolute value is greater than a predetermined constant B;

an eighth selector for selecting a positive constant B if a positive code is detected by the code extractor, and selecting a negative constant −B if a negative code is detected by the code extractor; and a ninth selector for outputting the output from the eighth selector if the absolute value is greater than the constant B, and selecting the output from the first adder if the absolute value is greater than the constant B, and outputting the selected value to the first and second delays.

11. The digital filter according to claim 1, wherein the first filter output unit is comprised of:

a multiplier for multiplying an output coefficient from the first coefficient update unit by the output data from the second data selection part; and a delay for delaying the output data from the multiplier synchronously with a clk with a ¼ phase difference from the clk, wherein the output from the delay is designated as a first output, and the output from the multiplier is designated as a second output.

12. The digital filter according to claim 1, wherein the second filter output unit is comprised of:

a multiplier for multiplying an output coefficient from the second coefficient update unit by the output-data from the fourth data selection part; and a delay for delaying the output data from the multiplier synchronously with a clk with a ¼ phase difference from the clk, wherein the output from the delay is designated as a third output; and the output from the multiplier is designated as a fourth output.

13. The digital filter according to claim 11 or claim 12, wherein if the digital filter is operated as a real valued filter according to the mode selection signal, the first to fourth outputs are summed up in a predetermined summation period and outputted as a final real valued filter output.

14. The digital filter according to claim 11 or claim 12, wherein if the digital filter is operated as a complex valued filter according to the mode selection signal, in the predetermined summation period a real valued filter output is obtained from a difference between the first output and the third output and a complex valued filter output is obtained from a sum of the second output and the fourth output.

15. A digital filter comprising:

a control unit for generating and outputting a mode selection signal through which the operations of a real valued filter and a complex valued filter are determined, and an operation selection signal for controlling corresponding operators perform the operations twice for a symbol clock (clk), the operation selection signal being generated by delaying a clock with a ½ phase difference from the clk by a predetermined time;

a data input unit for selecting an input real valued data and an input imaginary valued data according to the mode selection signal, delaying the data, respectively, selecting the input data and delayed data again according to the mode selection signal and the operation selection signal, and outputting the selected data for coefficient update and filter output;

a first coefficient update unit for multiplying the selected output data from the data input unit by an error value that is selected according to the mode selection signal and the operation selection signal, adding the multiplication result to an old coefficient that is selected according to the mode selection signal and the operation selection signal and thereby, updating two coefficients of the real valued filter and a real coefficient of the complex valued filter within one clock;

a second coefficient update unit for multiplying the selected output data from the data input unit by an error value that is selected according to the mode selection, signal and the operation selection signal, adding the multiplication result to an old coefficient that is selected according to the mode selection signal and the operation selection signal and thereby, updating two coefficients of the real valued filter and a real coefficient of the complex valued filter within one clock;

a first filter output unit for multiplying two data selectively outputted from to data input unit for a clock by the two coefficients of the real valued filter or the real coefficient of the complex valued filter provided from the first coefficient update unit and thereby, generating two tap outputs of the real valued filter or two outputs of the complex valued filter;

a second filter output unit for multiplying two data selectively outputted from the data input unit for a clock by the two coefficients of the real valued filter or the real coefficient of the complex valued filter provided from the second coefficient update unit and thereby, generating two tap outputs of the real valued filter or two outputs of the complex valued filter; and a final output unit for producing a final output of a tap real valued filter by adding all the outputs from the first and second filter output units if the mode selection signal indicates that the digital filter is in real valued filter mode, and producing a final output of a 1-tap complex valued filter, the final output being composed of a real valued output and an imaginary valued output, by adding or subtracting the outputs from the first and second output units together.

16. The digital filter according to claim 15, wherein the data input wait is comprised of:

a first data selection part for selecting within a clock a delayed real valued data and a delayed imaginary valued data, each being delayed by a predetermined period, according to the mode selection signal, and outputting the selected two data to the first coefficient update unit;

a second data selection part for delaying a delayless input real valued data and a delayless input imaginary valued data, respectively, selecting two data among the input data and the delayed data within a clock according to the mode selection signal and the operation selection signal, and outputting the selected two data to the first filter output unit;

a third data selection part for selecting within a clock a delayed real valued data and a delayed imaginary valued data, each being delayed by a predetermined period, according to the mode selection signal, and outputting the selected two data to the second coefficient update unit; and a fourth data selection part for delaying a delayless input real valued data, a delayless input imaginary valued data, and input data from the second data selection part, respectively, selecting two data among the input data and the delayed data within a clock according to the mode selection signal and the operation selection signal, and outputting the selected two data to the second filter output unit.

17. The digital filter according to claim 16, wherein the first data selection part is comprised of:

a first delay for delaying a delayed real valued input data synchronously with the clk;

a first selector for selectively outputting, according to the mode selection signal, one of delayed imaginary valued input data and the delayed real valued data provided from the first delay;

a second delay for delaying the output data from the first selector synchronously with the clk;

a second selector for selectively outputting, according to the mode selection signal, one of the output data from the second data selection part and the delayed real valued data provided from the first delay;

a third selector for selectively outputting, according to the mode selection signal, one of the output data from the second data selection part and the delayed data provided from the second delay; and a fourth selector for sequentially outputting, according to the operation selection signal, the output data from the second and third selectors to the first coefficient update unit for a clk.

18. The digital filter according to claim 16, wherein the second data selection part is comprised of:

a first delay for delaying a delayless real valued input data synchronously with the clk;

a first selector for selectively outputting, according to the mode selection signal, one of delayless imaginary valued input data and the delayed real valued data provided from the first delay;

a second delay for delaying the output data from the first selector synchronously with the clk;

a second selector for selectively outputting, according to the mode selection signal, one of the output data from the second data selection part and the delayed real valued data provided from the first delay;

a third selector for selectively outputting, according to the mode selection signal, one of the delayed data from the first delay and the delayed data from the second delay; and a fourth selector for sequentially outputting, according to the operation selection signal, the output data from the second and third selectors to the first coefficient update unit for a clk.

19. The digital filter according to claim 16, wherein the third data selection part is comprised of:

a first selector for selectively outputting, according to the mode selection signal, one of delayed imaginary valued input data and the delayed data provided from the second delay of the first data selection part;

a first delay for delaying the output data from the first selector synchronously with the clk;

a second selector for selectively outputting, according to the mode selection signal, one of delayed real valued input data and the delayed real valued data provided from the first delay;

a second delay for delaying the output data from the second selector synchronously with the clk;

a third selector for selectively outputting, according to the mode selection signal, one of the output data from the fourth data selection part and the delayed imaginary valued data provided from the first delay;

a fourth selector for selectively outputting, according to the mode selection signal, one of the output data from the fourth data selection part and the delayed data provided from the second delay; and a fifth selector for sequentially outputting, according to the operation selection signal, the output data from the third and fourth selectors to the second coefficient update unit for a clk.

20. The digital filter according to claim 16, wherein the fourth data selection part is comprised of:

a first selector for selectively outputting, according to the mode selection signal, one of delayless imaginary valued input data and the delayed data provided from the second delay of the second data selection part;

a first delay for delaying the output data from the first selector synchronously with the clk;

a second selector for selectively outputting, according to the mode selection signal, one of delayless real valued input data and the delayed real valued data provided from the first delay;

a second delay for delaying the output data from the second selector synchronously with the clk;

a third selector for selectively outputting, according to the mode selection signal, one of the output data from the first selector and the output data from the first delay;

a fourth selector for selectively outputting, according to the mode selection signal, one of the delayed data from the first delay and the delayed data from the second delay; and a fifth selector for sequentially outputting, according to the operation selection signal, the output data from the third and fourth selectors to the second filter output unit for a clk.

21. The digital filter according to claim 15, wherein the first coefficient update unit is comprised of:

a first selector for sequentially outputting, according to the operation selection signal, a real valued input error and an imaginary valued input error for a clk;

a second selector for selectively outputting, according to the mode selection signal, one of a real valued input error and the output data from the first selector;

a multiplier for multiplying the output data from the first data selection part by the output data from the second selector;

a first gain part for multiplying the output from the multiplier by a gain constant A;

a third selector for selectively outputting, according to the mode selection signal, one of the output data from the multiplier and the output data from the gain part;

a first adder for adding the output data from the third selector to an old feedback coefficient;

a saturator for limiting the addition result of the first adder if the addition result exceeds a predetermined value;

a first delay for delaying the output data from the saturator synchronously with a clk with a ½ phase difference from the clk;
  a second delay for delaying the output data from the saturator synchronously with the clk;
  a fourth selector for sequentially outputting, according to the operation selection signal, the delayed data from the first and second delays for a clk;
  a fifth selector for selectively outputting, according to the made selection signal, one of the output data from the fourth selector and the output data from the second delay;
  a second gain part for dividing the output data from the fifth selector by a gain constant C;
  a second ader for adding the output data from the first and the second delay;
  a sixth selector for sequentially outputting, according to the operation selection signal, a constant '0' and the output data from the second adder for a clk; and
  a seventh selector for selecting, according to the mode selection signal, one of the output data from the sixth selector, and the output data from the fourth selector, and outputting the selected data to the first adder as an old coefficient.

22. The digital filter according to claim 15, wherein the second coefficient update unit is comprised of:
  a first selector for sequentially outputting, according to the operation selection signal, a real valued input error and an imaginary valued input error for a clk;
  a second selector for selectively outputting, according to the mode selection signal, one of a real valued input error and the output data from the first selector;
  a multiplier for multiplying the output data from the third data selection part by the output data from the second selector;
  a third gain part for multiplying the output from the multiplier by a gain constant A;
  a third selector for selectively outputting, according to the mode selection signal, one of the output data from the multiplier and the output data from the gain part;
  an adder for adding the output data from the third selector to an old feedback coefficient;
  a saturator for limiting the addition result of the adder if the addition result exceeds a predetermined value;
  a first delay for delaying the output data from the saturator synchronously with a clk with a ½ phase difference from the clk;
  a second delay for delaying the output data from the saturator synchronously with the clk;
  a fourth selector for sequentially outputting, according to the operation selection signal, the delayed data from the first and second delays for a clk;
  a fifth selector for selectively outputting, according to the mode selection signal, one of the output data from the fourth selector and the output data from the second delay;
  a fourth gain part for dividing the output data from the fifth selector by a gain constant C;
  a subtracter for obtaining a difference between the delayed data provided from the first delay and the delayed data provided from the second delay;
  a sixth selector for sequentially outputting, according to the operation selection signal, a constant '0' and the output data from the subtracter for a clk; and
  a seventh selector for selecting, according to the mode selection signal, one of the output data from the sixth selector and the output data from the fourth selector, and outputting the selected data to the adder as an old coefficient.

23. The digital filter according to claim 15, wherein the first filter output unit is comprised of:
  a multiplier for multiplying an output coefficient from the first coefficient update unit by the output data from the second data selection part; and
  a delay for delaying the output data from the multiplier synchronously with a clk with a ¼ phase difference from the clk, wherein the output from the delay is designated as a first output, and the output from the multiplier is designated as a second output.

24. The digital filter according to claim 15, wherein the second filter output unit is comprised of:
  a multiplier for multiplying an output coefficient from the second coefficient update unit by the output data from the second data selection part; and
  a delay for delaying the output data from the multiplier synchronously with a clk with a ¼ phase difference from the clk, wherein the output from the delay is designated as a third output, and the output from the multiplier is designated as a fourth output.

* * * * *